United States Patent
Balla et al.

(10) Patent No.: US 8,352,218 B2
(45) Date of Patent: Jan. 8, 2013

(54) ACTIVE BUILDING INFORMATION MODELING APPARATUS AND METHOD

(75) Inventors: Mihaly Balla, Budapest (HU); Peter Mohacsi, Budapest (HU)

(73) Assignee: Graphisoft, Budapest (HU)

( * ) Notice: Subject to any disclaimer, the term of this patent is extended or adjusted under 35 U.S.C. 154(b) by 806 days.

(21) Appl. No.: 12/499,583

(22) Filed: Jul. 8, 2009

(65) Prior Publication Data

US 2011/0010134 A1    Jan. 13, 2011

(51) Int. Cl.
 G06F 17/50 (2006.01)
 G06F 19/00 (2011.01)
 G06T 15/00 (2011.01)
 G06T 17/00 (2006.01)
 G09G 5/00 (2006.01)

(52) U.S. Cl. ............ 703/1; 700/97; 700/98; 700/103; 345/419; 345/420; 345/581

(58) Field of Classification Search .......... 703/1, 7; 345/419, 420, 581; 700/97, 98, 103
See application file for complete search history.

(56) References Cited

U.S. PATENT DOCUMENTS

| | | | |
|---|---|---|---|
| 5,109,337 A | | 4/1992 | Ferriter et al. |
| 5,761,674 A | * | 6/1998 | Ito ........................ 707/999.104 |
| 5,918,232 A | * | 6/1999 | Pouschine et al. ..... 707/999.002 |
| 5,930,801 A | * | 7/1999 | Falkenhainer et al. 707/999.103 |
| 6,037,945 A | | 3/2000 | Loveland |
| 6,063,128 A | * | 5/2000 | Bentley et al. ................. 703/1 |
| 6,442,748 B1 | * | 8/2002 | Bowman-Amuah ... 707/999.104 |
| 6,526,406 B1 | * | 2/2003 | Suzuki et al. ............ 707/999.01 |
| 6,615,166 B1 | * | 9/2003 | Guheen et al. .................. 703/26 |
| 6,859,768 B1 | | 2/2005 | Wakelam et al. |
| 6,868,525 B1 | | 3/2005 | Szabo |
| 6,882,892 B2 | * | 4/2005 | Farrah et al. .................... 700/97 |
| 7,042,468 B2 | | 5/2006 | Schwegler et al. |
| 7,054,885 B1 | * | 5/2006 | Hoffman et al. ....... 707/999.103 |
| 7,231,410 B1 | * | 6/2007 | Walsh et al. ............... 707/999.2 |
| 7,233,885 B1 | | 6/2007 | Larabee et al. |

(Continued)

FOREIGN PATENT DOCUMENTS

EP          1 393 255          3/2004

OTHER PUBLICATIONS

"Revit Architecture 2009 User's Guide" (Revit2009 hereafter) Published Apr. 2008 pp. 1-1646.*

(Continued)

*Primary Examiner* — Kamini S Shah
*Assistant Examiner* — Akash Saxena
(74) *Attorney, Agent, or Firm* — Jackson Walker L.L.P.; Christopher J. Rourk

(57) ABSTRACT

An apparatus for coordinating building including a data memory for storing a three dimensional building model, the three dimensional building model having a plurality of elements, each element having a plurality of attributes. An element ownership processor for assigning ownership of each of the plurality of elements to one of a plurality of users, wherein each of the plurality of users has ownership of a subset of the plurality of elements. A model modification processor for receiving the three dimensional building model and for allowing a user to modify only elements that they have ownership of. A model synchronization processor for receiving only modified elements from the model modification processor and updating the three dimensional building model to include the modified elements.

13 Claims, 3 Drawing Sheets

U.S. PATENT DOCUMENTS

| | | | |
|---|---|---|---|
| 7,340,383 B2 * | 3/2008 | Mayuzumi et al. | 703/7 |
| 7,761,266 B2 * | 7/2010 | Mangon et al. | 703/1 |
| 7,859,544 B2 * | 12/2010 | Okada | 345/581 |
| 2001/0047251 A1 * | 11/2001 | Kemp | 703/1 |
| 2002/0013704 A1 | 1/2002 | Finney | |
| 2002/0035451 A1 | 3/2002 | Rothermel | |
| 2002/0129001 A1 * | 9/2002 | Levkoff et al. | 707/1 |
| 2002/0194113 A1 | 12/2002 | Lof et al. | |
| 2003/0036888 A1 * | 2/2003 | Bentley | 703/1 |
| 2003/0037182 A1 * | 2/2003 | Bentley | 709/328 |
| 2003/0050871 A1 | 3/2003 | Broughton | |
| 2003/0135401 A1 | 7/2003 | Parr | |
| 2003/0167265 A1 | 9/2003 | Corynen | |
| 2003/0225605 A1 | 12/2003 | Yokota et al. | |
| 2004/0024624 A1 * | 2/2004 | Ciscon et al. | 705/7 |
| 2004/0093559 A1 * | 5/2004 | Amaru et al. | 715/502 |
| 2004/0153824 A1 * | 8/2004 | Devarajan et al. | 714/38 |
| 2004/0205519 A1 | 10/2004 | Chapel et al. | |
| 2004/0230452 A1 * | 11/2004 | Abe et al. | 705/1 |
| 2005/0038636 A1 | 2/2005 | Wakelam et al. | |
| 2005/0108982 A1 | 5/2005 | Formisano | |
| 2005/0172260 A1 * | 8/2005 | Eichstaedt et al. | 717/104 |
| 2005/0188348 A1 * | 8/2005 | Han et al. | 717/105 |
| 2005/0197856 A1 | 9/2005 | Drucker | |
| 2006/0044307 A1 * | 3/2006 | Song | 345/419 |
| 2006/0190312 A1 * | 8/2006 | Onuma et al. | 705/7 |
| 2007/0013690 A1 * | 1/2007 | Grimaud et al. | 345/419 |
| 2007/0174027 A1 * | 7/2007 | Moiseyev | 703/1 |
| 2008/0077364 A1 * | 3/2008 | Wakelam et al. | 703/1 |
| 2009/0033656 A1 * | 2/2009 | Larkins et al. | 345/419 |
| 2009/0089291 A1 * | 4/2009 | Daily et al. | 707/9 |
| 2009/0113326 A1 * | 4/2009 | Miyamoto et al. | 715/764 |
| 2011/0010134 A1 * | 1/2011 | Balla et al. | 703/1 |
| 2011/0078169 A1 * | 3/2011 | Sit | 707/769 |
| 2012/0105449 A1 * | 5/2012 | Buchowski et al. | 345/420 |
| 2012/0190458 A1 * | 7/2012 | Gerson et al. | 345/419 |

OTHER PUBLICATIONS

EP Search Report dated Feb. 17, 2006 (6 pgs.), EP 05 25 6177.

Non-Final Office Action for U.S. Appl. No. 10/956,902 dated Jan. 10, 2007 (12 pgs.).

Wang et al., "4D Dynamic Resource Management for Construction Planning and Resource Utilization," Automation in Construction, vol. 13, Issue 5, pp. 575-589, Sep. 2004, available online—Jun. 1, 2004.

Kam et al., "The Product Model and Fourth Dimension Project," ITcon, vol. 8, pp. 137-166, 2003.

Kazi et al., "Management of Best Practices in Construction Through Interfacing with Product Models," obtained from http://cic.vtt.fi/projects/globemen/book/index.html, created Nov. 26, 2002, Presented as "Product Models as an Interface to Best Practice Management in the Construction Industry," eSM@RT, Nov. 19-21, pp. 1-13.

Kazi et al., "Distributed Engineering in Construction: Findings from the IMS GLOBEMEN Project," ITcon, vol. 6, 2001, pp. 129-148.

Froese et al., "Industry Foundation Classes for Project Management—A Trial Implementation," 1999, ITcon, vol. 4, pp. 17-36, http://www.itcon.org/1999/2.

Non-Final Office Action for U.S. Appl. No. 10/956,902 dated Aug. 29, 2007 (23 pgs.).

Non-Final Office Action for U.S. Appl. No. 10/956,902 dated Apr. 10, 2008 (25 pgs.).

PCT Search Report and Written Opinion for PCT/US06/37773 dated Feb. 12, 2008 (7 pgs.).

Non-Final Office Action for U.S. Appl. No. 11/375,871 dated May 13, 2008 (11 pgs.).

Final Office Action for U.S. Appl. No. 11/375,871 dated Nov. 26, 2008 (15 pgs.).

PCT Search Report and Written Opinion for PCT/US07/06353 dated Sep. 8, 2008 (10 pgs.).

Zhang et al., "4D Visualization of Construction Site Management," Information Visualization, 2001, Proceedings, Fifth International Conference on Information Visualization, pp. 382-387, posted online: Aug. 7, 2002.

Nyambayo et al., "External Product Library System—An Implementation Industry Foundation Classes Release 2.0 Library Model," 2003, retrieved from http://www.cs.auckland.ac.nz/~trebor/papers/NHYAM00A.pdf (10 pgs).

Office Action for U.S. Appl. No. 11/235,344 dated Aug. 24, 2007 (23 pgs.).

Final Office Action for U.S. Appl. No. 11/235,344 dated Jul. 8, 2008 (27 pgs.).

PCT Search Report and Written Opinion for PCT/US07/17828 mailed Nov. 18, 2008 (9 pgs.).

Lutz et al., "Analyzing Linear Construction Operations Using Simulation and Line of Balance," 1993, Transportation Research Board (Abstract), pp. 1-3.

Yang et al., "Stochastic Resource-Constrained Scheduling for Repetitive Construction Projects with Uncertain Supply of Resources and Funding," available online Apr. 18, 2005, International Journal of Project Management, vol. 23, pp. 546-553.

Kankainen et al., "A Line-of-Balance Based Schedule Planning and Control System," 2003, 11th International Group for Lean Construction Conference, Virginia Tech, Virginia (12 pgs.).

Trofin, "Impact of Uncertainty on Construction Project Performance Using Linear Scheduling," 2004, University of Florida, pp. iii-xiii and pp. 1-91.

Yang et al., Stochastic Analysis on Project Duration Under the Requirement of Continuous Resource Utilization, Aug. 2002, Proceedings IGLC-10, Brazil, pp. 1-13.

Non-Final Office Action for U.S. Appl. No. 11/502,690 dated Jul. 23, 2009 (14 pgs.).

McCabe, "Monte Carlo Simulation for Schedule Risks," 2003, Proceedings of the 2003 Winter Simulation Conference, pp. 1561-1565.

Altug, "Risk Management and Post Project Evaluation Processes for Research and Development Projects," 2002, Sabanci University, pp. 1-101.

Ma et al., "Application of 4D for Dynamic Site Layout and Management of Construction Projects," Automation Construction 14 (2005) pp. 369-381.

* cited by examiner

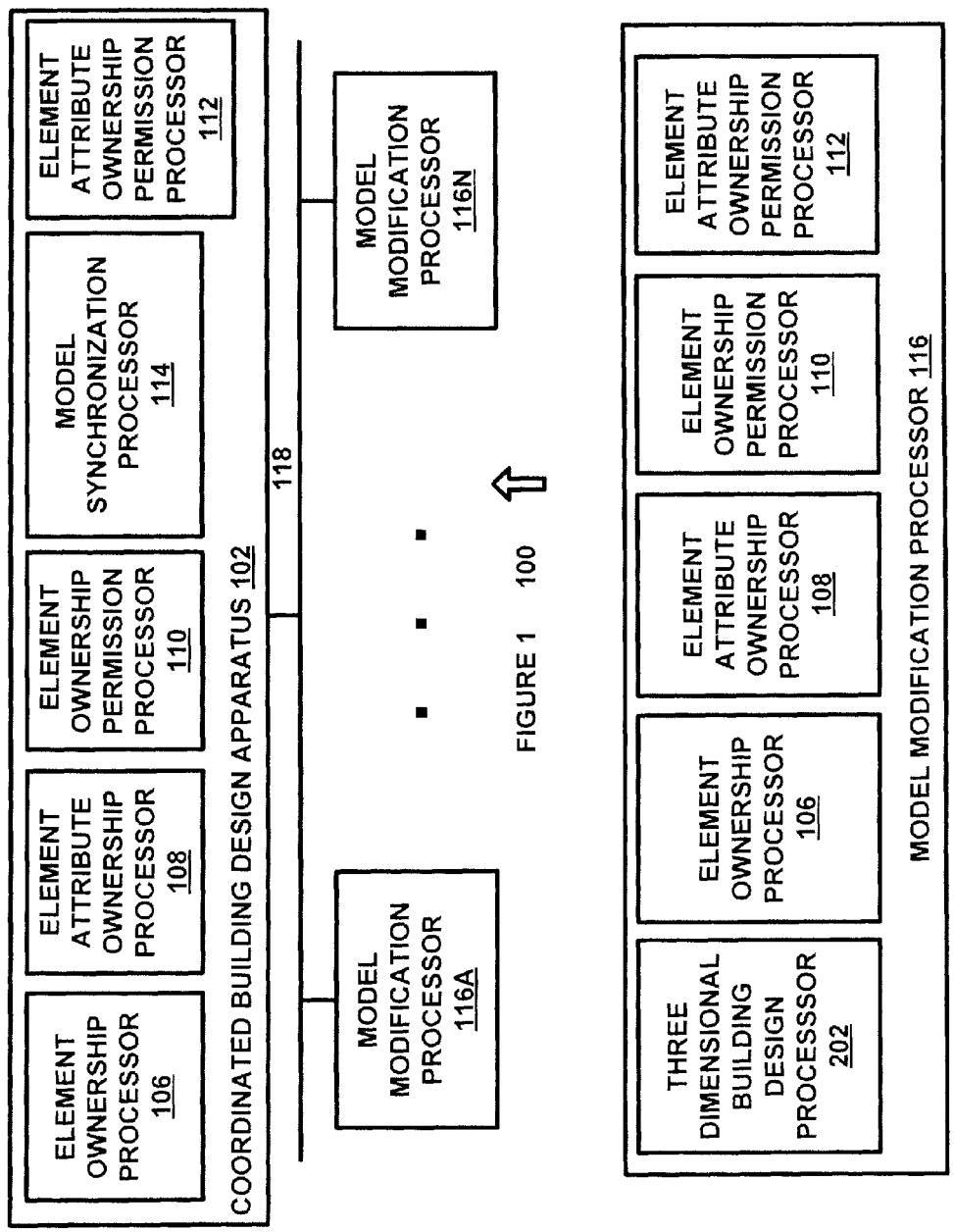

ACTIVE BUILDING INFORMATION MODELING APPARATUS AND METHOD

FIELD OF THE INVENTION

The invention relates to building design, and more particularly to an active building information modeling apparatus and method that reduce the amount of data that must be exchanged in order to synchronize distributed versions of a three dimensional building model.

BACKGROUND OF THE INVENTION

Building Information Modeling (BIM) refers to computer-assisted apparatuses that are used to design buildings and other structures. Existing BIM apparatuses can be used by multiple users, but have architectures that are time and data bandwidth intensive when the multiple users have to synchronize changes. For example, existing BIM apparatuses require the entire model to be repeatedly transferred in order to ensure that a user continually has the most current model.

SUMMARY OF THE INVENTION

In accordance with the present invention, an apparatus and method for synchronizing changes to a three dimensional building model are provided, which increase the speed and reduce the data bandwidth required to synchronize changes to a three dimensional building model.

In accordance with an exemplary embodiment of the present invention, an apparatus for coordinating building design is provided. The apparatus includes a data memory for storing a three dimensional building model, the three dimensional building model having a plurality of elements, each element having a plurality of attributes. An element ownership processor for assigning ownership of each of the plurality of elements to one of a plurality of users, wherein each of the plurality of users has ownership of a subset of the plurality of elements. A model modification processor for receiving the three dimensional building model and for allowing a user to modify only elements that they have ownership of. A model synchronization processor for receiving only modified elements from the model modification processor and updating the three dimensional building model to include the modified elements.

Those skilled in the art will further appreciate the advantages and superior features of the invention together with other important aspects thereof on reading the detailed description that follows in conjunction with the drawings.

BRIEF DESCRIPTION OF THE SEVERAL VIEWS OF THE DRAWINGS

FIG. 1 is a diagram of an apparatus for coordinated building design in accordance with an exemplary embodiment of the present invention;

FIG. 2 is a diagram of an apparatus for mode modification processing in accordance with an exemplary embodiment of the present invention;

DETAILED DESCRIPTION OF PREFERRED EMBODIMENTS

Figure 3:
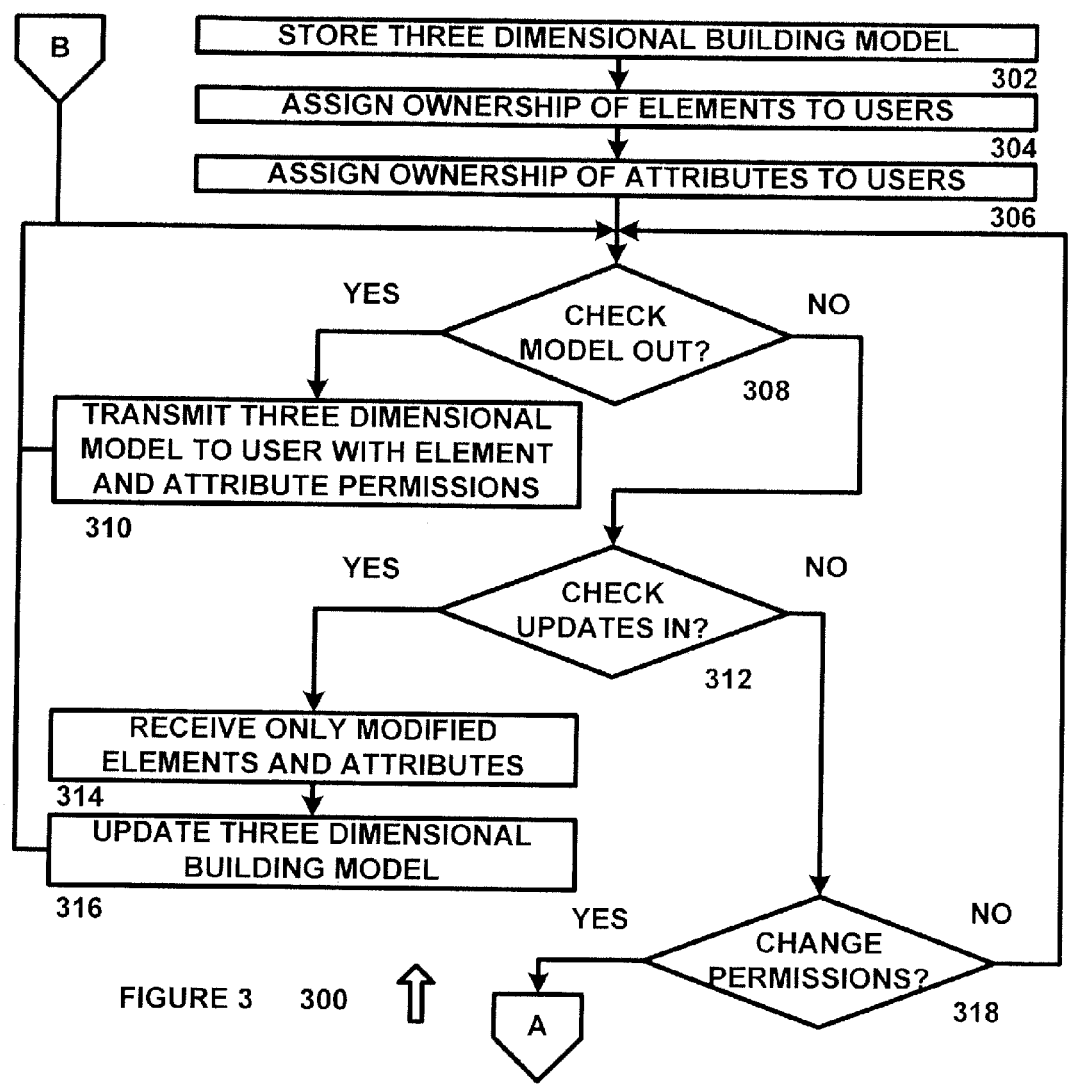
FIG. 3 is a diagram of a flowchart algorithm that can be used to create and modify a three dimensional building model in accordance with an exemplary embodiment of the present invention.

In the description that follows, like parts are marked throughout the specification and drawings with the same reference numerals, respectively. The drawing figures might not be to scale and certain components can be shown in generalized or schematic form and identified by commercial designations in the interest of clarity and conciseness.

FIG. 1 is a diagram of an apparatus 100 for coordinated building design in accordance with an exemplary embodiment of the present invention.

Apparatus 100 includes coordinated building design apparatus 102, communications medium 118 (which can be a wire line medium, a wireless medium, other suitable media or a suitable combination of media), and model modification processors 116A through 116N. In one exemplary embodiment, coordinated building design apparatus 102 can be implemented as a special purpose machine, such as by utilizing algorithms executed by a general purpose processing platform. Likewise, coordinated building design apparatus 102 can be implemented in the hardware, a suitable combination of hardware and software, or in other suitable manners. As used herein, "hardware" can include a combination of discrete components, an integrated circuit, an application-specific integrated circuit, a field programmable gate array, a digital signal processor, or other suitable hardware. As used herein, "software" can include one or more objects, agents, threads, lines of code, subroutines, separate software applications, two or more lines of code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

Coordinated building design apparatus 102 includes element ownership processor 106, element attribute ownership processor 108, element ownership permission processor 110, element attribute ownership permission processor 112 and model synchronization processor 114, each of which can be implemented as special purpose processors by executing predetermined algorithms on a general purpose processing platform or in other suitable manners, such as in hardware or a suitable combination of hardware and software. Coordinated building design apparatus 102 can also store a three dimensional building design model, such as the most current version of a three dimensional building design model that is used to control the status of distributed copies of the three dimensional building design model.

Element ownership processor 106 is a special purpose machine that allows one or more users to each be associated with one or more elements of the three dimensional building model. In one exemplary embodiment, each element of a three dimensional building design model can be assigned to a specific user as an owner. In this exemplary embodiment, in order to modify any of the elements, the modification must be performed by a model modification processor 116 that is associated with the user that is the owner of the element. In this manner, element ownership processor 106 prevents other users from modifying an element that they are not owners of. For example, element ownership processor 106 may include a user log-on process or algorithm that identifies the user that is accessing the three dimensional building model, where each element and element attribute of the three dimensional building model includes a field identifying the user that owns the element, the user that has an exclusive right to modify the element, or other suitable users.

Element attribute ownership processor 108 is a special purpose machine that allows one or more global element attributes to be assigned to a user for each of the global element attributes. In one exemplary embodiment, a global element attribute can be a characteristic of all instances of an attribute in an element, such as a type of wall, the cut fill of a wall section, the line type of a wall section or other suitable element attributes. In this exemplary embodiment, in order to change each occurrence of the attribute in an element, the global element attribute must owned by the user that is modifying that attribute. Element attribute ownership processor 108 allows ownership of the global attribute for all instances of an elements to be assigned to a specific user, such that a change to a global element attribute for an element will result in that change being reflected in all instances of that element within a three dimensional building model. In another exemplary embodiment, a global element attribute for a type of brick may include the color, such as "red," or other such features of the brick element. If a user wants to change the color of the global brick element from "red" to another color, such as "yellow," then the user can change the global element attribute from "red" brick to "yellow" brick as long as the user has ownership of that global element attribute. Likewise, additional changes may be required, such as to change a product identifier or unit price, the change may be made to correct a data entry error, or other suitable changes can be made. The global element attribute is distinguished from changing an attribute for a specific element, such as by changing the type of brick from an existing "red" brick global attribute to an existing "yellow" brick global attribute for a single brick element, a wall element, a group of brick elements, or other individual elements owned by a user. In this example, the type of attribute associated an element is changed from a first existing type of attribute to a second existing type of attribute and can be classified as a modification of the element, as opposed to a modification of a global change to all occurrences of the first existing type of element attribute throughout the three dimensional building model.

Element ownership permission processor 110 is a special purpose machine that allows a user that is not an owner of an element to request permission to modify, delete, or otherwise change the element from the owner of the element. In one exemplary embodiment, element ownership permission processor 110 can allow a user to submit a request to an element owner, and can route the response to the request back to the submitter, such as by changing ownership from the current owner to the requester, by setting a predetermined data field associated with the element to indicate that the requester has an exclusive right to modify the element, by informing the requester that the request for access was denied, or in other suitable manners. In one exemplary embodiment, element ownership permission processor 110 can allow a user to access an element for a predetermined period of time, for a predetermined number of modifications, or in other suitable manners, without changing ownership of the element. Element ownership permission processor 110 can be used with model modification processors 116 to both generate requests from a third party and to receive requests to allow an owner to grant or deny permission.

Element attribute ownership permission processor 112 is a special purpose machine that allows a user that does not have ownership of a global element attribute to request permission to modify, delete, or otherwise access a global element attribute. In one exemplary embodiment, element attribute ownership permission processor 112 can receive a request from a user to access a global element attribute that the user does not own and can forward the request to the owner of the global element attribute. Likewise, element attribute ownership permission processor 112 can set relevant permissions if the owner agrees to allow permission to modify or change global element attributes, such as by changing a predetermined data field associated with the attribute to reflect that the requester has an exclusive right to modify the global element attribute, by setting an ownership identifier field associated with the global element attribute to reflect that the requester is the current owner, to limit the number of changes or period of time the global element attribute can be changed by the requester, or in other suitable manners. Element attribute ownership permission processor 112 can be used in conjunction with model modification processors 116 to both generate requests from a third party and to receive requests to allow an owner to grant or deny permission.

Model synchronization processor 114 is a special purpose machine that allows a three dimensional building model stored in a data memory to be synchronized with changes made to the three dimensional building model by model modification processors 116A through 116N. In one exemplary embodiment, model synchronization processor 114 limits the amount of data that has to be interchanged between model modification processors 116A through 116N and coordinated building design apparatus 102. In this exemplary embodiment, model synchronization processor 114 only receives from model modification processors 116A through 116N those elements or element attributes that have been modified. Because only one user can have ownership of an element or attribute at a time, model synchronization processor 114 can modify the elements or attributes of the central three dimensional building model, and can further synchronize such modified elements with other associated models that are being accessed by users of model modification processors 116A through 116N. In this manner, the amount of data required in order to update the most current version of the three dimensional building model stored by coordinated building design apparatus 102 can be minimized to only those elements or element attributes that have been modified, added, or that are otherwise new for each model as it is modified through model modification processors 116A through 116N. Likewise, the three dimensional building models stored at other model modification processors 116A through 116N can be updated with such limited and minimal data sets. Model synchronization processor 114 can also download a current version of the centrally stored three dimensional building model stored by coordinated building design apparatus 102 to a model modification processor 116A through 116N if the model modification processor does not have a current version of the three dimensional building model.

Model modification processors 116A through 116N are special purpose machines that allow users to obtain the current version of the central three dimensional building design from coordinated building design apparatus 102, and to modify those elements or element attributes for the three dimensional building design that the user is owner of In one exemplary embodiment, each model modification processor 116A through 116N can be associated with a predetermined user, can identify a user utilizing a logon procedure or the user provides a user ID, or other suitable processes can be used to identify the user that is accessing a three dimensional building model, in order to prevent unauthorized users from accessing the model and to control the changes that can be made to a model by a user. Model modification processors 116A through 116N allow users to modify only the elements and element attributes of a three dimensional building model that they own, and also allow users to request access to elements or element attributes that are owned by others if the user needs access in order to modify, delete, or otherwise change an element or element attribute of a three dimensional building model. When the user has completed the changes to elements of the three dimensional building model, including adding new elements, modifying elements that the user is owner of or has permission to modify, or other suitable changes, the model modification processor 116A through 116N that the user is using coordinates modification of the centrally-stored three dimensional building model at coordinated building design apparatus 102 (which is the primary version of the building model) through model synchronization processor 114. Model synchronization processor 114 receives only the modified elements, element attributes, or other elements such as added elements from the model modification processor 116A through 116N that is synchronizing design changes, and model synchronization processor 114 then stores or modifies the three dimensional building model stored by coordinated building design apparatus 102 to reflect those changes in the primary model. Model synchronization processor 114 then transmits the changes to the other secondary versions of the three dimensional building design model that are being used by other model modification processors 116A through 116N. The changes to the secondary versions of the three dimensional building design model that are being used by other model modification processors 116A through 116N can be implemented immediately, periodically, upon request, when synchronization occurs for changes implemented at the other model modification processors 116A through 116N, or in other suitable manners.

In operation, apparatus 100 allows a plurality of users to coordinate the modification of a three dimensional building model using coordinated building design apparatus 102 with plurality of model modification processors 116. Apparatus 100 assigns ownership of elements and element attributes of three dimensional building models, where the number of elements for a three dimensional building model can be large, and where elements of the three dimensional building model have associated attributes. By allowing users to modify only elements that they have ownership of, the amount of data that needs to be transmitted between each of the model modification processors 116A through 116N and the coordinated building design apparatus 102 over communications media 118 can be minimized, so as to allow only those elements or element attributes that have been changed to be transmitted. Apparatus 100 coordinates modification of the centralized/primary three dimensional building model stored at coordinated building design apparatus 102 and the distributed/secondary building models stored at each of the other model modification processors 116 that have not modified the associated elements (and which are owned by other users). In this manner, the distributed models can be updated as changes occur, on demand, when the other users synchronize, or in other suitable manners.

FIG. 2 is a diagram of an apparatus 200 for model modification processing in accordance with an exemplary embodiment of the present invention. Apparatus 200 includes model modification processor 116 and three dimensional building design processor 202, element ownership processor 106, element attribute ownership processor 108, element ownership permission processor 110 and element attribute ownership permission processor 112, each of which can be a special purpose machine, a general purpose platform executing one or more algorithms or other suitable hardware or combinations of hardware and software.

Three dimensional building design processor 202 is a special purpose machine that allows a user to modify a local version of the three dimensional building model using predetermined elements having predetermined attributes, where the elements or attributes that can be modified by the user are either owned by the user, or where the user requests and receives permission to modify the elements or attributes from the owner. In one exemplary embodiment, the elements can include predetermined or predefined elements such as walls, floors, doors, windows, ceilings, support elements, stairways, or other suitable building elements. Likewise, three dimensional building design processor 202 can allow users to define a new element, to change the attributes of an element, to change global element attributes, to create new elements such as sub-elements of an existing element (e.g. wall sections, floor sections), or to perform other suitable three dimensional building design processes. The three dimensional building model generated by three dimensional building design processor 202 is synchronized with the centrally stored version of the three dimensional building model at coordinated building design apparatus 102 by model synchronization processor 114. Three dimensional building design processor 202 can also be used to generate the first version of the centrally stored version of the three dimensional building model at coordinated building design apparatus 102, such as by a user having suitable permission or authorization. Two dimensional models, four-dimensional models (i.e. models that track changes over time) or other suitable models can also or alternatively be used.

Element ownership processor 106, element attribute ownership processor 108, element ownership permission processor 110 and element attribute ownership permission processor 112 have been previously described in regards to coordinated building design apparatus 102, and have functions similar to the previously defined functions. However, three dimensional building design processor 202 of apparatus 200 is used to modify a secondary version of a three dimensional building model that is a copy of the current version of the centrally-stored primary three dimensional building model stored at coordinated building design apparatus 102. In this exemplary embodiment, a user can receive a copy of a primary three dimensional building model from coordinated building design apparatus 102, which includes identification of the owners of each of the three dimensional building model elements and elements attributes, and the user can modify those elements that the user is owner of. Apparatus 200 then coordinates with model synchronization processor 114 of apparatus 100 to provide only those elements that have been changed, added, deleted, or otherwise modified, and model synchronization processor 114 of apparatus 100 modifies the primary three dimensional building model stored by three dimensional building design processor 202, as well as the secondary three dimensional building model stored by other three dimensional building design processors 202 at other apparatuses 200. Likewise, if other three dimensional building design processors 202 at other apparatuses 200 have modified elements or global attributes, those changed elements or global attributes can be synchronized to the locally stored three dimensional building model at apparatus 200 to provide the most current version of the three dimensional building model with minimal data transfer requirements.

In operation, apparatus 200 allows a plurality of users to access a centralized building model stored in coordinated building design apparatus 102 and to modify only those elements and element attributes of the three dimensional building model that the user has ownership of. Apparatus 200 allows the user to request permission to have ownership access to an element or a global element attribute, and allows parameters to be set to control the length of time of permission, the number of modifications, the types of changes that can be made, or other suitable controls.

FIG. 3 is a diagram of a flowchart algorithm 300 that can be used to create and modify a three dimensional building model in accordance with an exemplary embodiment of the present invention. Flowchart algorithm 300 can be used on a general purpose processor to convert it to a special purpose machine and can be implemented using a suitable programming language. Likewise, pseudo code can also be used to convey the flowchart algorithm shown in algorithm 300, as discussed herein.

Flowchart algorithm 300 begins at 302 where a three dimensional building model is stored. In one exemplary embodiment, the three dimensional building model can be created using a three dimensional building design processor 202 or other suitable systems, such as by selecting a building model from a library of building models, or in other suitable manners. The three dimensional building model can be a centrally stored or primary model that is used as a repository for the most recent version of the model, where modifications are made to secondary versions of the model that are locally stored by other users. In pseudo code, an algorithm associated with 302 can be generally expressed as:

Get remote file=three dimensional building model data
Store file
The algorithm then proceeds to 304.

At 304, ownership of elements is assigned to users. In one exemplary embodiment, the three dimensional building model that has been stored will have a plurality of elements, ranging from hundreds of elements at an early stage or for a simple building to tens of thousands or more at an advanced stage, and each element can be assigned to users, such as based on the type of element, the location of elements, or in other suitable manners. The elements can be assigned by entering element identifiers in a user interface that requests groups of elements by type (e.g. floor, ceiling, wall, door, window), location (e.g. first floor, second meeting room), or in other suitable manners. In another exemplary embodiment, a primary user that has permission or authority to assign ownership of elements to other users can select elements in a two or three dimensional view of a building model, such as by using a cursor and associated graphical controls, and can be prompted to enter an associated user, can activate a control for assigning a user, or other suitable algorithms can be used. In pseudo code, an algorithm associated with 304 can be generally expressed as:

Get set of element identifiers
Get user
Assign user to each element identifier ownership field in set
Repeat until all element identifiers have users
The algorithm then proceeds to 306.

At 306 the ownership of global element attributes is assigned to users for the three dimensional model. In one exemplary embodiment, a user can execute an interface to select global element attributes based on the elements that the user can access, to limit ownership of global element attributes to predetermined users, or in other suitable manners. In pseudo code, an algorithm associated with 306 can be generally expressed as:

Get set of element attribute identifiers
Get user
Assign user to each element attribute identifier ownership field in set
Repeat until all element attribute identifiers have users
The algorithm then proceeds to 308. The process state prior to 308 can also be a "waiting" state, such as after an initial building model is developed, and the initial assignment of ownership of elements and element attributes is performed. As such, flowchart algorithm 300 does not terminate per se, but rather allows users to modify and update a three dimensional building model until it is independently determined that the model is ready to be deployed. Changes can also be made to the model after deployment, such as during construction so as to reflect the current building configuration.

At 308 it is determined whether a request has been received to check a model out. In one exemplary embodiment, a user can request access to the most recent version of a three dimensional building design model, so as to allow the user to make modifications, deletions, additions, or other suitable changes to elements of the three dimensional building design model. If it is determined that no request has been received at 308 then the algorithm proceeds to 312, otherwise the algorithm proceeds to 310 and the three dimensional building model is transmitted to the user with element and element attribute permissions. In one exemplary embodiment, each element of the three dimensional building model can have associated attributes, and each element and element attribute can have associated permissions for users that are owners, where users that are not owners have "read only" access to the elements and element attributes. In this manner, if a user has checked out a model and wants to modify, delete, add or otherwise change an element or a global element attribute, the user can request permission from the current owner of the element or element attribute. In pseudo code, an algorithm associated with 308 can be generally expressed as:

Test: request for model?
If yes: retrieve current central model file data and transmit to requester
If no: proceed to next test
The algorithm then returns to 308.

At 312, it is determined whether to check in updates to the centrally-stored primary copy of the three dimensional building model. If it is determined at 312 that is necessary to check in updates, the algorithm proceeds to 314. Otherwise, the algorithm proceeds to 318. In pseudo code, an algorithm associated with 312 can be generally expressed as:

Test: check-in updates for model?
If yes: notify requester to transmit updates
If no: proceed to next test At 314, only the modified elements and global element attributes are received from a remote model modification processor 116 or other suitable devices. In this exemplary embodiment, a user may have a model with tens of thousands of elements but may only be working on a small subset of those elements, such as several hundred. The user may also delete or add additional elements or global element attributes based on the user's permission settings. The modified, added or deleted elements and global element attributes that the user has the right to modify are received at 314 so as to prevent the necessity for transmission of the entire three dimensional building model and the associated time required for transfer of such voluminous data. In pseudo code, an algorithm associated with 314 can be generally expressed as:

Receive modified, deleted and added elements and global element attributes
Confirm user authorized to modify
The algorithm then proceeds to 314.

At 316, the three dimensional building model is updated, such as by updating a centrally-stored primary version of the three dimensional building model, by forwarding the changed elements and global element attributes to distributed secondary versions of the centralized three dimensional building model, or in other suitable manners. In pseudo code, an algorithm associated with 316 can be generally expressed as:
Replace existing elements and global element attributes with modified and deleted elements and global element attributes
Add new elements and global element attributes
Transmit modified, deleted and added elements and global element attributes to each checked-out secondary copy, confirm receipt
The algorithm then returns to 308.

At 318, it is determined whether permission changes have been requested. In one exemplary embodiment, permission changes can be requested from a user that does not have ownership of an element or global attribute, and can be routed to the user that does have ownership of the element or global attribute. If it is determined at 318 that a change in permissions has not been requested, the algorithm returns to 308, otherwise the algorithm proceeds to connector. A of FIG. 4. In pseudo code, an algorithm associated with 318 can be generally expressed as:
Test: request to change permissions?
If yes: execute change permissions algorithm
If no: return to waiting state Flowchart algorithm 300 allows users to be assigned ownership of elements and global element attributes of a centrally-stored primary three dimensional building model and to access and modify predetermined elements and global element attributes that are owned by the user or that the user has the exclusive right to modify, in a secondary copy of the three dimensional building model. In this manner, multiple users can access and update a centrally-stored primary building model by receiving a most recent secondary version of the three dimensional building model from the central storage location, and by modifying, deleting or adding elements and global element attributes based on permissions. When the user has reached a completion stage, the changes to the elements or global element attributes can be transmitted back to the centrally stored primary model, while all unchanged elements or global element attributes are not transmitted back. The secondary models for all other users can then receive the changed elements or global element attributes after it has been confirmed at the central or primary model that the user had appropriate permission to modify, delete or add the changed elements or global element attributes. A user that does not have permission to change an element or global element attribute can also request permission to change the element or global element attribute from the user that has ownership of the element or global element attribute.

Figure 4:
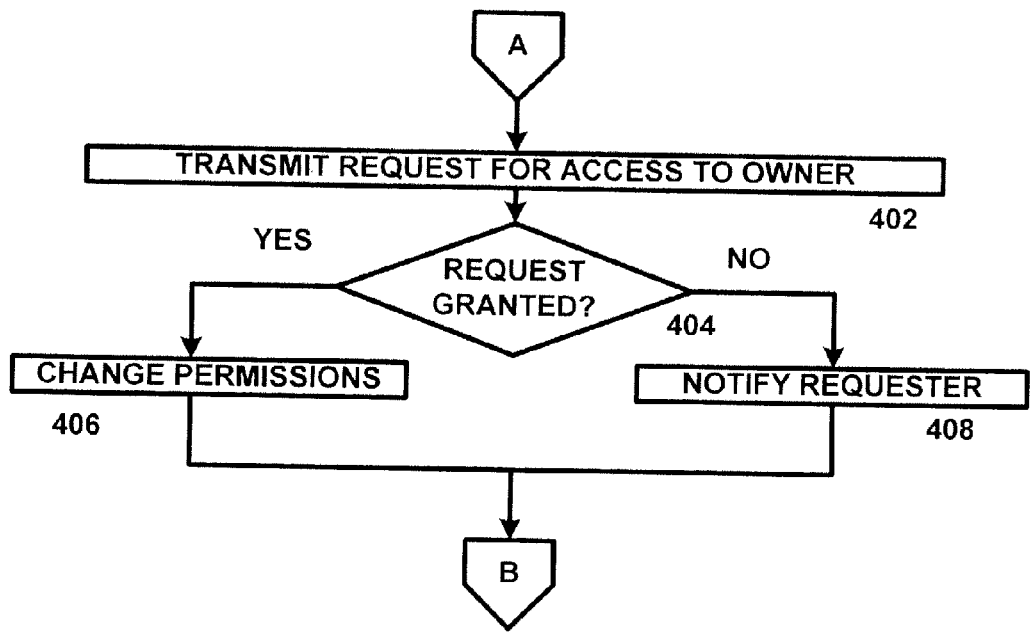
FIG. 4 is a diagram of a flowchart algorithm for changing ownership permissions for elements or element attributes of a three dimensional building model in accordance with an exemplary embodiment of the present invention.

FIG. 4 is a diagram of a flowchart algorithm 400 for changing ownership permissions for elements or global element attributes of a three dimensional building model in accordance with an exemplary embodiment of the present invention. Flowchart algorithm 400 can be used on a general purpose processor to convert it to a special purpose machine and can be implemented using a suitable programming language. Likewise, pseudo code can also be used to convey the flowchart algorithm shown in algorithm 400, as discussed herein.

Flowchart algorithm 400 begins at transfer point A from flowchart algorithm 300, and proceeds to 402 where a request for access is transmitted to an owner of an element or global element attribute, such as through a centralized coordinated building design apparatus 102, directly, or in other suitable manners. In one exemplary embodiment, each element or element attribute can have an associated owner, and the request for access can identify or be routed to the owner and can include suitable parameters such as a time period for access, a number of changes, or other suitable limitations. In pseudo code, an algorithm associated with 402 can be generally expressed as:
Retrieve ownership information from element data field
Transmit request for access or ownership transfer to owner
The flowchart algorithm then proceeds to 404.

At 404, it is determined whether a request has been granted. In one exemplary embodiment, an owner can indicate that the request has been granted by selecting an "accept" control that has been generated on a display of a special purpose apparatus or in other suitable manners. Likewise, the owner can also modify the request for ownership, such as by adding one or more conditions restricting the period of time, number of modifications, whether additions or deletions are allowed, limitations related to the types of fields that can be modified for an element attribute, or other suitable restrictions. If it determined that the request is granted, the algorithm proceeds to 406, otherwise the algorithm proceeds to 408. In pseudo code, an algorithm associated with 404 can be generally expressed as:
Test: request granted?
If yes: proceed to 406
If no: proceed to 408

At 406, notification is generated that the request has been granted or modified, and a permission field, control or other suitable data for the associated element or global element attribute is changed, such as at the previous owner's secondary copy of the three dimensional building model, at the new owner's secondary copy of the three dimensional building model, at the central or primary copy of the building model and at each secondary instance of the building model that was created from the central/primary version of the building model, so as to allow other users to know the current owner of an element, or in other suitable manners. In pseudo code, an algorithm associated with 406 can be generally expressed as:
Approve permission change request/modified request
Update permission setting at all instances of the model
The flowchart algorithm then proceeds to B which transfers control back to flowchart algorithm 300, at which point it proceeds to 308.

If it is determined at 404 that the request for ownership access has not been granted, the algorithm proceeds to 408 where the requester is notified. In one exemplary embodiment, data can be provided to the requester, such as a data field that identifies why the request has not been granted. In this exemplary embodiment, the current owner may have multiple requests from different users, and can request the users to determine between themselves which one should be granted access, the current owner may be modifying the requested element or global element attribute and the requester can be notified that access to the element or global element attribute will not be provided until after the current modifications are updated, or other suitable data can be provided to the requester. In pseudo code, an algorithm associated with 408 can be generally expressed as:
Receive data regarding denial of permission change request
Transmit to requester The flowchart algorithm then proceeds to B which transfers control back to flowchart algorithm 300, at which point it proceeds to 308.

In operation, flowchart algorithm 400 allows a user to request permission to change elements or global element attributes in a three dimensional building model, and updates the ownership status of the element or global element attribute in all secondary instances of the model that have been checked out to other users as well as to a centrally stored primary version of the model. In this manner, all changes to the model can be coordinated between multiple users and the most recent version of the model can be controlled.

Figure 5:
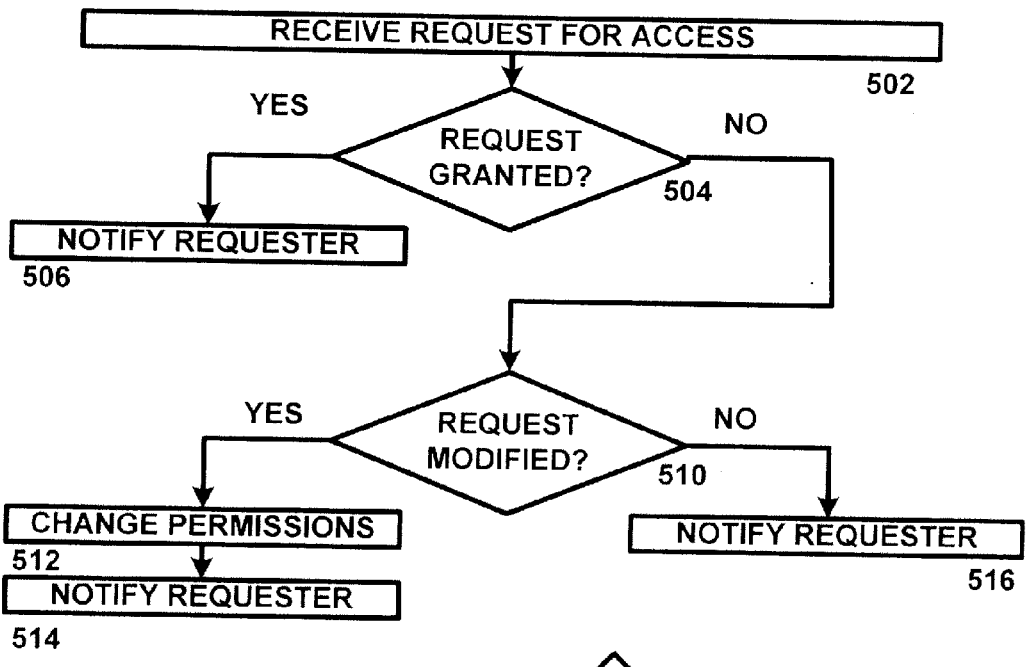
FIG. 5 is a diagram of a flowchart algorithm for approving ownership permission changes for elements or element attributes in a three dimensional building model in accordance with an exemplary embodiment of the present invention.

FIG. 5 is a diagram of a flowchart algorithm 500 for approving ownership permission changes for elements or global element attributes in a three dimensional building model in accordance with an exemplary embodiment of the present invention. Flowchart algorithm 500 can be used on a general purpose processor to convert it to a special purpose machine and can be implemented using a suitable programming language. Likewise, pseudo code can also be used to convey the flowchart algorithm shown in algorithm 500, as discussed herein.

Flowchart algorithm 500 begins at 502 where a request for access is received by an owner of an element or global element attribute, such as through a centralized coordinated building design apparatus 102, directly, or in other suitable manners. In one exemplary embodiment, each element or global element attribute can have an associated owner, and the request for access can identify or be routed to the owner and can include suitable parameters such as a time period for access, a number of changes, or other suitable limitations. A suitable display can be generated to notify the owner that a request has been received, such as a pop-up window, a message indicator or flag, or other suitable displays. In pseudo code, an algorithm associated with 502 can be generally expressed as:
Receive request for ownership transfer
Generate display showing receipt of request
The flowchart algorithm then proceeds to 504.

At 504, it is determined whether a request has been granted. In one exemplary embodiment, an owner can indicate that the request has been granted by selecting an "accept" control that has been generated on a display of a special purpose apparatus or in other suitable manners. If it is determined that the request is granted, the algorithm proceeds to 506 where permissions are changed, otherwise the algorithm proceeds to 510. In pseudo code, an algorithm associated with 504 can be generally expressed as:
test: request granted?
If yes: proceed to 506
If no: proceed to 510

At 506, permissions are changed, such as at the prior owner's secondary copy of the three dimensional building model, at the new owner's secondary copy of the three dimensional building model, at the central/primary version of the building model and at each secondary instance of the three dimensional building model that was created from the central version of the building model, so as to allow other users to know the current owner of an element, or in other suitable manners. The requester can also be notified that the request has been accepted. In pseudo code, an algorithm associated with 506 can be generally expressed as:
Approve permission change request
Update permission setting at all instances of the model
Notify requester
The algorithm then terminates.

If it is determined at 504 that the request for access has not been granted, the algorithm proceeds to 510 where it is determined whether the request should be modified. For example, a suitable display that is generated to notify the owner that a request has been received, such as a pop-up window, a message indicator or flag, or other suitable displays, can also include a "modify" control, or other suitable mechanisms can be used to modify the request. In one exemplary embodiment, the request for access can request a change in ownership, and the current element or global element attribute owner may determine that access to the element or global element attribute may still be required in the future. In this exemplary embodiment, the current owner can determine that the request can be granted if modified to add restrictions. In another exemplary embodiment, a user may request restricted access to an element or global element attribute, and the owner may determine that the user should receive ownership of the element or global element attribute. If it is determined that the request should be modified at 510, the algorithm proceeds to 512, otherwise the algorithm proceeds to 516. In pseudo code, an algorithm associated with 510 can be generally expressed as:
Test: modify request?
If yes: proceed to 512
If no: proceed to 516

At 512, the requested permissions are modified, such as to limit the number of times an element or global element attribute can be revised, to limit whether the element or global element attribute can be deleted, to limit whether new elements can be added, to limit the time period over which the element can be modified by the requester, to change ownership, or to make other suitable modifications to the request. In pseudo code, an algorithm associated with 512 can be generally expressed as:
Receive, display requested permissions and other associated permission fields
Receive and implement modifications to permission fields
The algorithm then proceeds to 514.

At 514, notification is generated that the request has been modified, and a permission field, control or other suitable data is changed, such as at the prior owner's secondary copy of the three dimensional building model, at the new owner's secondary copy of the three dimensional building model, at the central/primary version of the building model and at each secondary instance of the building model that was created from the central/primary version of the building model, so as to allow other users to know the current owner of an element, or in other suitable manners. In pseudo code, an algorithm associated with 514 can be generally expressed as:
Approve modified request
Update permission setting at all instances of the model
Notify requester
The flowchart algorithm then terminates.

At 516, notification is generated that the request has been denied. In pseudo code, an algorithm associated with 516 can be generally expressed as:
Deny request
Notify requester
The flowchart algorithm then terminates.

In operation, flowchart algorithm 500 allows a user that has ownership of an element or global element attribute to receive a request from another user to change ownership, to grant access to the element or global element attribute for a predetermined period of time, or to otherwise allow another user to modify the element or global element attribute. Flowchart algorithm 500 is invoked when a request is transmitted to a user that has ownership of the element or global element attribute, and terminates after the request has been processed.

While certain exemplary embodiments have been described in detail and shown in the accompanying drawings, it is to be understood that such embodiments are merely illustrative of and not restrictive on the broad invention. It will thus be recognized to those skilled in the art that various modifications may be made to the illustrated and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope and the spirit of the invention defined by the appended claims.

What is claimed is:

1. An apparatus for coordinating building design comprising:
    a data memory for storing a three dimensional building model, the three dimensional building model having a plurality of elements, each element having a plurality of attributes;
    an element ownership processor for assigning ownership of each of the plurality of elements to one of a plurality of users, wherein each of the plurality of users has ownership of a subset of the plurality of elements;
    an element attribute ownership processor for assigning ownership of a plurality of element attributes for an element to a first user of the plurality of users and receiving a request from a second user of the plurality of users to access one of the plurality of element attributes for the element assigned to the first user and changing a predetermined data field associated with the one of the plurality of attributes to reflect that the second user has an exclusive right to modify the one of the plurality of attributes or is the current owner of the one of the plurality of attributes;
    a model modification processor for receiving the three dimensional building model and for allowing a user to modify only elements and element attributes that they have ownership of; and
    a model synchronization processor for receiving only modified elements and element attributes from the model modification processor and updating the three dimensional building model to include the modified elements.

2. The apparatus of claim 1 further comprising an element ownership permission processor for receiving a request for permission to access a selected element of the plurality of elements from the second user that is not an owner of the selected element, obtaining permission from the first user that is the owner of the selected element, and changing an ownership status for the selected element to reflect that the second user has an exclusive right to modify the selected element.

3. The apparatus of claim 1 wherein the element attribute ownership processor is for assigning ownership of each of the plurality of element attributes to one of the plurality of users, wherein each user of a subset of the plurality of users has ownership of a subset of the plurality of elements.

4. A method for coordinating building design comprising:
    storing in a data memory of a central processor a three dimensional building model, the three dimensional building model having a plurality of elements, each element having a plurality of attributes;
    assigning ownership of each of the plurality of elements to one of a plurality of users, wherein each of the plurality of users has ownership of a subset of the plurality of elements;
    receiving the three dimensional building model at a remote processor and allowing a user to modify only elements that they have ownership of;
    assigning ownership of a plurality of element attributes for an element to a first user of the plurality of users;
    receiving a request from a second user of the plurality of users to access one of the plurality of element attributes for the element assigned to the first user;
    changing a predetermined data field associated with the one of the plurality of attributes to reflect that the second user has an exclusive right to modify the one of the plurality of attributes or is the current owner of the one of the plurality of attributes; and
    receiving only modified elements from the model modification processor at the central processor and updating the three dimensional building model to include the modified elements.

5. The method of claim 4 further comprising:
    receiving a request for permission to access a selected element of the plurality of elements from the second user that is not an owner of the selected element;
    obtaining permission to access the selected element from the first user that is the owner of the selected element; and
    changing an ownership status for the selected element to reflect that the second user has an exclusive right to modify the selected element.

6. The method of claim 5 further comprising allowing the first user to modify only elements that they own and elements that they have the exclusive right to modify.

7. The method of claim 4 further comprising assigning ownership of each of the plurality of element attributes to one of a plurality of users, wherein each user of a subset of the plurality of users has ownership of a subset of the plurality of elements.

8. The method of claim 7 further comprising:
    receiving a request for permission to access a selected element attribute of the plurality of element attributes from the second user that is not an owner:
    obtaining permission to access the selected element attribute from the first user that is the owner; and
    changing an ownership status for the selected element attribute to reflect that the second user has an exclusive right to modify the selected element attribute.

9. The method of claim 8 further comprising allowing a user to modify only element attributes that they own and element attributes that they have the exclusive right to modify.

10. The method of claim 9 further comprising receiving only modified element attributes from the model modification processor and updating the three dimensional building model to include the modified element attributes.

11. A computer apparatus for coordinating building design comprising:
    means for storing a three dimensional building model, the three dimensional building model having a plurality of elements, each element having a plurality of attributes;
    means for assigning ownership of each of the plurality of elements to one of a plurality of users, wherein each of the plurality of users has ownership of a subset of the plurality of elements;
    means for assigning ownership of a plurality of element attributes for an element to a first user of the plurality of users and receiving a request from a second user of the plurality of users to access one of the plurality of element attributes for the element assigned to the first user and changing a predetermined data field associated with the one of the plurality of attributes to reflect that the second user has an exclusive right to modify the one of the plurality of attributes or is the current owner of the one of the plurality of attributes;

means for receiving the three dimensional building model and for allowing a user to modify only elements that they have ownership of; and means for receiving only modified elements from the model modification processor and updating the three dimensional building model to include the modified elements.

12. The computer apparatus of claim 11 further comprising means for receiving a request for permission to access a selected element of the plurality of elements from the second user that is not an owner of the selected element, obtaining permission from the first user that is the owner of the selected element, and changing an ownership status for the selected element to reflect that the second user has an exclusive right to modify the selected element.

13. The computer apparatus of claim 12 wherein the means for receiving the three dimensional building model and for allowing the first user to modify only elements that they own further comprises means for allowing the first user to also modify only elements that they have the exclusive right to modify.

* * * * *